Figure 1:
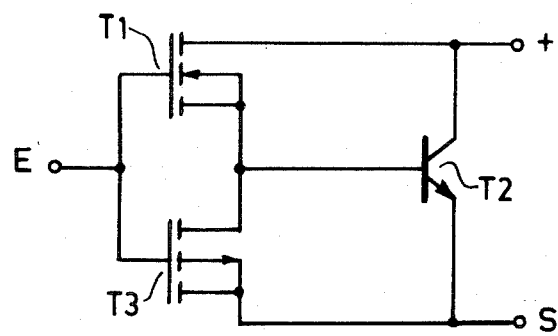

United States Patent [19]

Roger et al.

[11] Patent Number: 4,547,791
[45] Date of Patent: Oct. 15, 1985

[54] CMOS-BIPOLAR DARLINGTON DEVICE

[75] Inventors: Bernard P. Roger, Carpiquet; Bernard Vertongen, Caen, both of France

[73] Assignee: U.S. Philips Corporation, New York, N.Y.

[21] Appl. No.: 360,291

[22] Filed: Mar. 22, 1982

[30] Foreign Application Priority Data

Apr. 29, 1981 [FR] France .................. 81 08550

[51] Int. Cl.⁴ ............ H01L 27/06; H01L 29/78; H01L 29/70
[52] U.S. Cl. .................. 357/43; 357/23.4; 357/42; 357/46
[58] Field of Search ........... 357/43, 46, 23 VD, 42, 357/56; 307/446, 570

[56] References Cited

U.S. PATENT DOCUMENTS

| | | | |
|---|---|---|---|
| 3,636,372 | 1/1972 | Hujita et al. | 357/43 |
| 4,164,747 | 8/1979 | Gerstner | 357/46 |
| 4,286,175 | 8/1981 | Baker | 357/43 |
| 4,329,705 | 5/1982 | Baker | 357/43 |
| 4,356,416 | 10/1982 | Weischedel | 307/570 |
| 4,360,822 | 11/1982 | Roger | 357/56 |

FOREIGN PATENT DOCUMENTS 5455178  2/1979  Japan ..................... 357/42

Primary Examiner—William D. Larkins
Assistant Examiner—Eric Fallick
Attorney, Agent, or Firm—Paul R. Miller

[57] ABSTRACT

A semiconductor device having in a semiconductor body a Darlington amplifier comprising a vertical enhancement VMOS-transistor ($T_1$) as input transistor and a vertical bipolar power transistor ($T_2$) as output transistor. In order to increase the switching speed, a lateral enhancement MOS transistor ($T_3$) of complementary conductivity type to the first transistor ($T_1$) is connected in parallel with the emitter-base junction of the bipolar output transistor ($T_2$). The gate electrodes of the first and second transistors are interconnected and associated with an input terminal E. Double and treble epitaxial layer structures are disclosed for integrating the device in the semiconductor body. The lateral third transistor ($T_3$) may be provided either within or outside the area of an epitaxial layer forming the emitter zone of the second transistor ($T_2$).

3 Claims, 4 Drawing Figures

CMOS-BIPOLAR DARLINGTON DEVICE

The invention relates to a semiconductor device having a semiconductor body comprising a monolithic integrated Darlington circuit having an input first transistor and an output second transistor with the first transistor being formed by a vertical enhancement insulated gate field effect transistor of the VMOST-type, and the second transistor being a vertical bipolar power transistor.

The invention is particularly but not exclusively useful for providing power amplifiers having short switching times, which amplifiers may be used notably for line scanning of picture display devices.

For this type of application, a MOS power transistor might be used. A MOS power transistor has the advantage on the one hand of being faster than a bipolar transistor of equal power; and on the other hand for its control little energy is necessary, which enables negative feedback coupling with an integrated circuit. However, in the case of circuit elements which can be used at medium voltage and high voltage, the obtaining of a low saturation voltage (or also a low series resistance $R_{ON}$) results in a large surface area requirement for the semiconductor body due to the space required for the channel region of the transistor.

For the same power level, a known Darlington circuit formed by two bipolar transistors requires much less semiconductor material and is more easy to manufacture. Its saturation voltage is also low. On the other hand, however, for controlling the known Darlington device significant energy is necessary and its switching performances are lower than those of the MOS-transistor.

The known hybrid combination of a MOS input transistor and a bipolar output transistor enables an improved Darlington circuit to be obtained. With dimensions equal to those of a bipolar-bipolar Darlington, employing substantially the same amount of semiconductor material, the MOS-bipolar circuit requires very little input energy so that it can be coupled directly to an integrated control circuit; moreover its saturation voltage is low. However, there remains a problem of switching time which, due to the presence of the bipolar output transistor, is too high for the desired application.

A semiconductor device having the features described in the opening paragraph is known from French Patent Application No. 2,457,566. In this known device the base-emitter path of the bipolar output transistor is bridged by a resistor having a low value, of approximately 1 ohm. The resulting increased switching speed is satisfactory since due to the resistor the charges stored in the base of the output transistor during the preceding conducting period can flow away rapidly as soon as the input transistor is cut off; in this manner the output transistor rapidly returns to the "off" state. However, the gain of the output transistor is considerably reduced due to the low resistance of this resistor.

One of the objects of the invention is to provide an integrated Darlington amplifier which can be easily integrated and in which the disadvantages associated with the known devices can be reduced or avoided at least substantially and in which a high switching speed and a high gain can be obtained together with a low control energy and without requiring a large area of semiconductor material.

A semiconductor device having the features described in the opening paragraph is characterized according to the invention in that the device comprises a third transistor which is formed by a lateral enhancement insulated gate field effect transistor of complementary conductivity type to the first transistor with the third transistor being connected in parallel with the emitter-base junction of the second transistor, and the gate electrodes of the first and third tarnsistors being interconnected.

The third transistor serves to improve the switching speed of the amplifier. During the time in which at a given polarity of the input voltage the first transistor and the second transistor are conductive, the third transistor is cut off and does not interfere with the normal operation of the amplifier. As soon as the polarity of the input voltage is reversed, the third transistor becomes conductive and short circuits the emitter-base current path of the second transistor; and the charges which are stored in the base of the second transistor can flow away directly via the third transistor, so that the output current drops rapidly and the second transistor returns to the "off" state.

The switching time of a power amplifier constructed in accordance with the invention therefore can be very short. In a bipolar-bipolar Darlington amplifier and in a MOS bipolar Darlington amplifier in accordance with the invention, the switching times in substantially equal operating conditions are typically, for example 2 to 3 $\mu$s and 0.2 to 0.25 $\mu$s, respectively; this means for a device in accordance wih the invention a speed which is approximately ten times as large as that of the known bipolar-bipolar Darlington.

On the other hand a device in accordance with the invention has a large amplification since during the conducting periods the resistance of the third transistor is high and the control current of the second transistor cannot flow via the third transistor as is the case with the low ohmic resistors used in the earlier mentioned French Application No. 2,457,566.

In addition the required control energy is low; on the other hand, with equal performance, in particular with respect to the speed, the semiconductor area necessary for the construction is approximately equal to half the area required for a MOS transistor, With a semiconductor area which is substantially equal to the surface required for, an integrated bipolar Darlington amplifier it is possible to couple an amplifier in accordance with the invention, due to its low control energy, directly with a further integrated circuit. The choice of a vertical VMOS-configuration for the first transistor and of a lateral configuration for the complementary third transistor highly facilitates the integration of these transistors in the semiconductor body.

This integration can be realized in a comparatively simple and compact manner when the semiconductor body comprises a substrate region of a first conductivity type on which there are provided successively a first epitaxial layer of the opposite second conductivity type and a second epitaxial layer of the first conductivity type, and the substrate region forms the drain zone of the first transistor and the collector zone of the second transistor, the first epitaxial layer forms the base zone of the second transistor, the emitter zone of the second transistor is formed by a part of the second epitaxial layer with the part surrounding a more highly doped surface zone of the first conductivity type, the base zone of the second transistor is connected to the surface by connection zones of the second conductivity type with one of the connection zones surrounding a surface-adjoining source zone of the first conductivity type of the first transistor, a groove intersects the source zone and connection zone and extends into the substrate region with the groove being lined with an insulating layer on which a gate electrode is provided, and the source and drain zones of the third transistor are formed by first and second surface zones of the second conductivity type of which the first adjoins a connection zone.

In one form of this preferred construction the third transistor is provided in the part of the second epitaxial layer forming the emitter zone of the second transistor, and the second surface zone of the second conductivity type adjoins the more highly doped surface zone of the first conductivity type. An advantage of this form is that, due to the fact that the third transistor is situated within the emitter of the second transistor, its integration requires no extra area on the semiconductor body.

In another form of the preferred construction the third transistor is provided outside the emitter region of the second transistor and is separated therefrom by a connection zone. In this case the integration of the third transistor requires an increase of the semiconductor surface area with respect to the area which is occupied only by the first and second transistors. However, due to the fact that the third transistor is situated at a distance from the emitter of the second transistor, the occurrence of electrical interference phenomena can be avoided in some applications.

Figure 2:
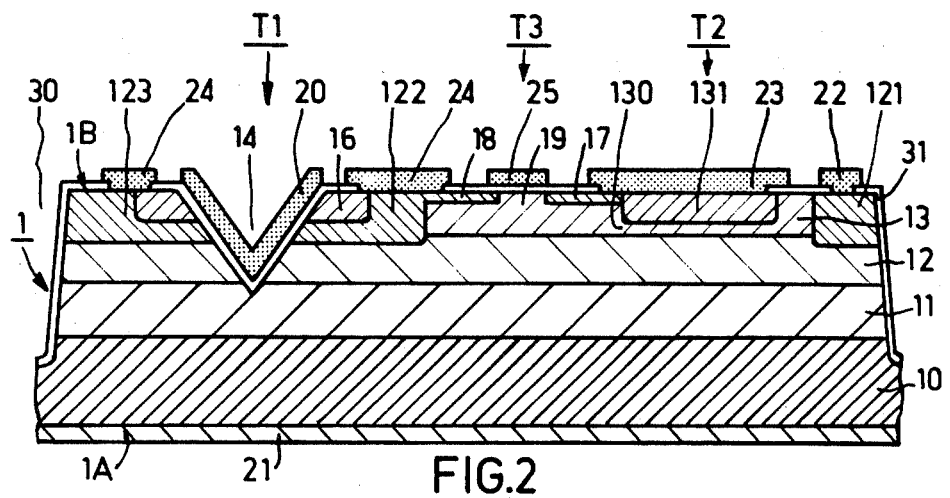
Figure 3:
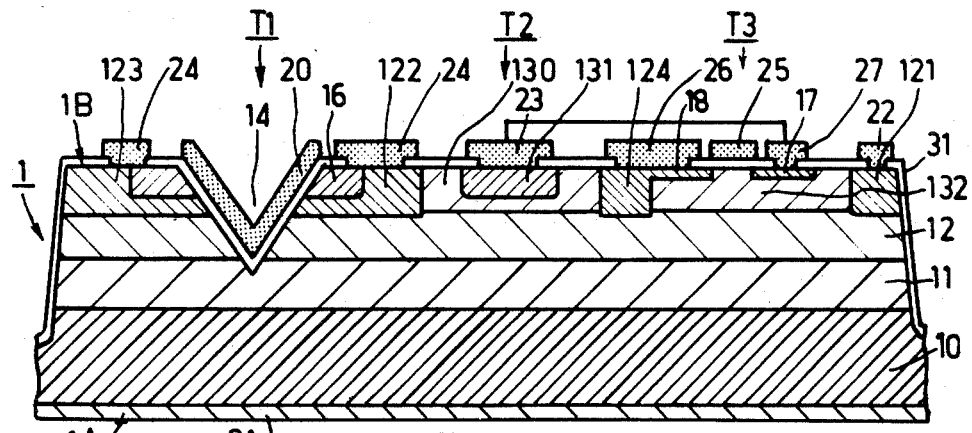
Figure 4:
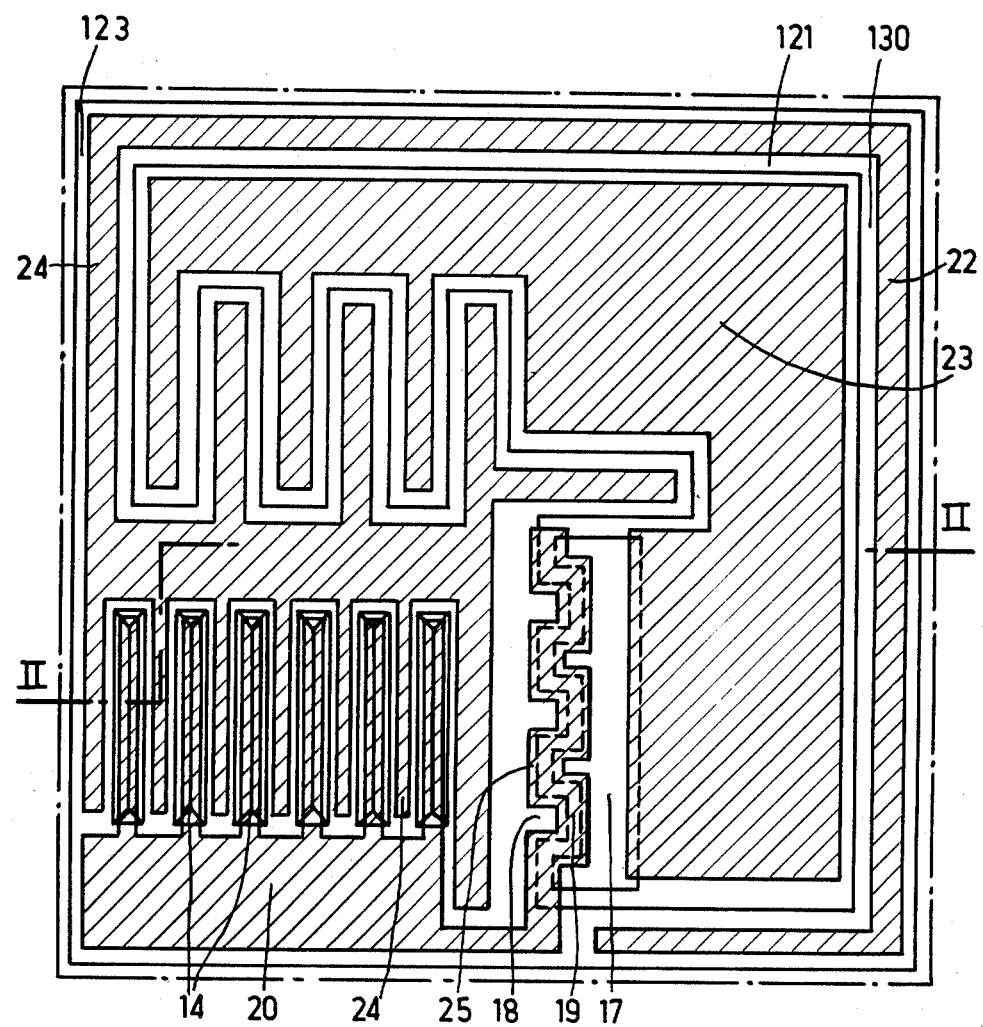

Embodiments of the invention will now be described, by way of example, with reference to the accompanying drawings, in which FIG. 1 shows the electrical circuit diagram of a semiconductor device having a Darlington amplifier in accordance with the invention, FIG. 2 is a diagrammatic cross-sectional view taken on the line II—II of FIG. 4 of part of the body of an integrated semiconductor device in accordance with the invention, FIG. 3 is a diagrammatic cross-sectional view of part of the body of another integrated semiconductor device in accordance with the invention, and FIG. 4 is a plan view of the semiconductor device shown in FIG. 2.

It is to be noted that FIG. 2, 3 and 4 are purely diagrammatic and are not drawn to scale. Notably the part of the device which comprises the third transistor is shown widened. Moreover, in the plan view of FIG. 4, the layout of the emitter-base boundary line of the bipolar transistor at the area where the third transistor is present is simplified (by emitting interdigital manders). All this is to clarify the drawing.

The semiconductor device shown in the FIG. 1 diagram comprises a first transistor $T_1$, or the input transistor, which is coupled to second transistor $T_2$, or the output transistor with the two transistors together constituting a circuit which is known as a Darlington amplifier. The first transistor $T_1$ is an insulated gate field effect transistor of the enhancement type, in this example an N channel transistor. The second transistor $T_2$ is a bipolar power transistor of the NPN type, As shown in the Figure, the source electrode of $T_1$ is connected to the base of $T_2$, the drain electrode of $T_1$ and the collector of $T_2$ are connected to the positive supply terminal and the gate electrode of $T_1$ is connected to the input terminal E, while the emitter of $T_2$ is connected to the output terminal S of the amplifier.

In accordance with the invention, a third transistor $T_3$ formed by a further enhancement insulated gate field effect transistor of complementary conductivity type to $T_1$ (in this case a P-channel transistor) is connected directly in parallel with the emitter-base junction of the second transistor, the gate electrodes of the said first and third transistors $T_1$ and $T_3$ being interconnected.

With reference to the diagram of FIG. 1 and the following Figures this means that the drain electrode of $T_3$ is both connected to the base of $T_2$ and to the source electrode of $T_1$, that the source electrode of $T_3$ is connected to the emitter of $T_2$, and that the gate electrodes of $T_1$ and $T_3$ are both connected to the input terminal E. All three transistors $T_1$, $T_2$ and $T_3$ are formed in a common semiconductor body, for example of silicon.

FIGS. 2 and 4 show the amplifier of FIG. 1 constructed in a semiconductor structor of the MESA type.

The amplifier is provided in a semiconductor body 1 having a substrate region which in this example consists of two parts, namely a highly doped substrate 10 of a first conductivity type (in this case the N-type) and provided thereon an epitaxial layer 11 also of the N-type but lower doped than the substrate 10. On this substrate region 10, 11 there are successively provided a first epitaxial layer 12 of the P type and a second epitaxial layer 13 of the N-type which are both relatively low doped.

The layer 12 is connected to the surface 1B by means of highly doped P-type connection zones 121, 122 and 123.

The "highly doped" regions in this example have a doping concentration which is higher than $10^{17}$ atoms/cm$^3$, preferably higher than $10^{18}$ atoms/cm$^3$, while the "lower doped" regions have a doping concentration which is lower than $10^{17}$ atoms/cm$^3$ and preferably lower than $10^{16}$ atoms/cm$^3$.

V-shaped grooves 14 are provided in zone 122 and extend from the surface 1B through the layers 13 and 12 and into the layer 11 of the substrate region.

The substrate region (10, 11) forms the drain zone of $T_1$ and the collector zone of $T_2$. The base zone of $T_2$ is present in the layer with the connection zones forming base connections; in the layer 12(as well as in the connection zone 122) the channel of $T_1$ is also formed, along the sides of the grooves 14. The emitter zone of $T_2$ is formed in the part 130 of the layer 13 present between the zones 121 and 122; in this part a more highly doped N-type surface zone 131 is provided, the thickness of which is smaller than that of the layer 13. The source zone of $T_1$ is formed by a region 16 which is surrounded by the connection zone 122 and which is present around the groove 14; the region 16 is of the N-type, is highly doped, and has substantially the same thickness as the region 131.

The semiconductor body 1, on the sides 30 which form the boundaries of the mesa and over a part of the surface 1B including the groove 14, is covered with an insulating layer 31 through which contact windows are provided and on which the gate electrode 20 of $T_1$ is present. On the lower side 1A of the substrate an electrode layer 21 is provided which contacts the collector of $T_2$ and the drain electrode of $T_1$: and on the surface 1B the base of $T_2$, the emitter of $T_2$, the source electrode of $T_1$ and the base of $T_2$ are contacted with electrodes 22, 23 and 24.

The semiconductor body 1 also comprises the third transistor $T_3$ the source and drain zones of which are formed by first and second surface zones (18, 17) of the second (in this case P) conductivity type: the former zone 18 adjoins a connection zone, in this case the zone 122.

Between the two surface zones 17 and 18 a P-type channel may be formed in a surface strip 19 of the epitaxial layer 13 when the gate electrode 25 is brought to a suitable potential. The gate electrode 25 of the lateral field effect transistor $T_3$ is connected to the gate electrode 20 of the VMOS transistor $T_1$ as shown in FIG. 4.

The surface and the shape of the strip 19 and the gate electrode 25 as shown in FIG. 4 are given only by way of example. It will be obvious that requirements with regard to the electrical properties may lead to different configurations in different circumstances.

In the embodiment illustrated in FIGS. 2 and 4 the third transistor $T_3$ is present in the part 130 of the second epitaxial layer 13 which forms the emitter zone of the second transistor $T_2$, the zone 17 being present beside the more highly doped surface zone 131 which is surrounded by the region 130.

In another embodiment a cross-sectional view of which is shown in FIG. 3 the third transistor $T_3$ is present in a part 132 of the second epitaxial layer 13 which is present at a distance from the part 130 which forms the emitter zone of transistor $T_2$.

This latter embodiment involves the formation of an extra connection zone 124 so that the layer portions 130 and 132 are separated from each other at least partly. The zone 18 adjoins the connection zone 124 of which it forms a continuation. An electrode layer 27 on the zone 17 must be connected to the electrode layer 23 so as to ensure the necessary electrical connection between the source electrode 17 of $T_3$ and the emitter zone 130-131 of $T_2$.

Such devices in accordance with the invention may be manufactured using known techniques. The amplifier described with reference to FIGS. 2 and 4 can be manufactured, for example, starting from an N+ type silicon substrate having crystal orientation <100> and a doping level which corresponds to a resistivity of approximately 0.018ohm. cm. The surface of which the substrate may be approximately 4 mm×4 mm per device. The method comprises the following steps:

- epitaxial vapour deposition of the N-type sublayer 11 (thickness 10 to 14 μm; resistivity approximately 3 to 6 ohm.cm)
- epitaxial vapour deposition of the P-type layer 12 (thickness 14 to 18 μm; resistivity approximately 4 to 7 ohm. cm)
- epitaxial vapour deposition of the N-type layer 13 (thickness 5 to 7 μm; resistivity approximately 3 to 7 ohm.cm)
- local diffusion of the P-type connection zones 121, 122, 123 (thickness 6.5 to 8 μm; sheet resistance approximately 100 ohm)
- local vapour deposition of the region 131 of $T_2$ and of the drain electrode 16 of $T_1$ (thickness 2.5 to 3 μm; sheet resistance approximately 2 ohm)
- local diffusion of the source and drain zones 17 and 18 of $T_3$; P-type diffusion (thickness 2 to 2.5 μm; sheet resistance approximately 40 ohm)
- etching to form the mesa shape;
- vapour deposition of a passivating oxide layer over the whole surface (0.8 to 1 μm);
- providing grooves 14 extending into the layer 11 by means of anisotropic etching; the grooves are parallel and their mututal distance is approximately 40 μm;
- removal of the oxide from surface 1B at the area of the grooves 14 and channel 19 of $T_3$ and vapour-depositing, at least in these places, a clean insulating layer (having a thickness of 0.1 to 0.15 μm);
- providing the aluminium contacts and the gate electrodes of the transistors $T_1$ and $T_3$.

Many modifications are possible within the scope of this invention. Thus, for example, semiconductor materials other than silicon may be used, for example germanium or gallium arsenide. Insulating layers of a material other than silicon oxide may also be used. Furthermore, all conductivity types may (simultaneously) be replaced by their opposite types, while, as already stated, various lay-out geometrics may be used to optimise the device characteristics for specific applications.

What is claimed is:

1. A semiconductor device having a semiconductor body comprising a monolithic integrated Darlington circuit having an input first transistor and an output second transistor, said first transistor being formed by a vertical enhancement insulated gate field effect transistor of the VMOST-type, and said second transistor being a vertical bipolar power transistor, characterized in that the device comprises a third transistor formed by a lateral enhancement insulated gate field effect transistor of complementary conductivity type to said first transistor, said third transistor being connected in parallel with an emitter-base junction of said second transistor, and said gate electrodes of said first and third transistors being interconnected, characterized in that said semiconductor body comprises a substrate region of a first conductivity type on which there are successively provided a first epitaxial layer of the opposite second conductivity type and a second epitaxial layer of said first conductivity type, wherein said substrate region forms a drain zone of said first transistor and a collector zone of said second transistor, wherein said first epitaxial layer forms a base zone of said second transistor, and an emitter zone of said second transistor is formed by a part of said second epitaxial layer, said part surrounding a more highly doped surface zone of said first conductivity type, said base zone of said second transistor being connected to the surface by connection zones of said second conductivity type, one of said connection zones surrounding a surface-adjoining source zone of said first conductivity type of said first transistor, wherein a groove intersects said source zone and connection zone and said groove extends into said substrate region, said groove being lined with an insulating layer on which a gate electrode is provided, and wherein said source and drain zones of said third transistor are formed by first and second surface zones of said second conductivity type, said first surface zone adjoining a connection zone.

2. A semiconductor device as claimed in claim 1, characterized in that said third transistor is provided in a part of said second epitaxial layer forming said emitter zone of said second transistor, and wherein the secnd said surface zone of said second conductivity type adjoins said more highly doped surface zone of said first conductivity type.

3. A semiconductor device as claimed in claim 1, characterized in that said third transistor is provided outside said emitter region of said second transistor and is separated therefrom by a connection zone.

* * * * *